United States Patent
Matsui et al.

(10) Patent No.: US 12,301,036 B2
(45) Date of Patent: May 13, 2025

(54) MANAGEMENT APPARATUS FOR ENERGY STORAGE DEVICE, ENERGY STORAGE APPARATUS, AND INPUT/OUTPUT CONTROL METHOD FOR ENERGY STORAGE DEVICE

(71) Applicant: GS Yuasa International Ltd., Kyoto (JP)

(72) Inventors: Hiroki Matsui, Kyoto (JP); Yuta Kashiwa, Kyoto (JP); Seijiro Ochiai, Kyoto (JP)

(73) Assignee: GS YUASA INTERNATIONAL LTD., Kyoto (JP)

( * ) Notice: Subject to any disclaimer, the term of this patent is extended or adjusted under 35 U.S.C. 154(b) by 107 days.

(21) Appl. No.: 17/636,523

(22) PCT Filed: Aug. 27, 2020

(86) PCT No.: PCT/JP2020/032369
§ 371 (c)(1),
(2) Date: Feb. 18, 2022

(87) PCT Pub. No.: WO2021/039905
PCT Pub. Date: Mar. 4, 2021

(65) Prior Publication Data
US 2022/0271550 A1    Aug. 25, 2022

(30) Foreign Application Priority Data
Aug. 30, 2019    (JP) ................................. 2019-158285

(51) Int. Cl.
*H02J 7/00*    (2006.01)
*G01R 31/3842*    (2019.01)
*H01M 10/48*    (2006.01)

(52) U.S. Cl.
CPC ........ *H02J 7/0049* (2020.01); *G01R 31/3842* (2019.01); *H01M 10/482* (2013.01)

(58) Field of Classification Search
CPC .. H02J 7/0049; H02J 7/0048; G01R 31/3842; H01M 10/482
(Continued)

(56) References Cited

U.S. PATENT DOCUMENTS

2008/0048619 A1    2/2008 Yoshida
2012/0086368 A1    4/2012 Kawabuchi et al.
(Continued)

FOREIGN PATENT DOCUMENTS

JP    2005-345254 A    12/2005
JP    2006-338944 A    12/2006
(Continued)

OTHER PUBLICATIONS

English translation of JP2015061505, Mar. 30, 2015. (Year: 2015).*
(Continued)

*Primary Examiner* — Michael P Nghiem
(74) *Attorney, Agent, or Firm* — Alston & Bird LLP

(57) ABSTRACT

The present invention comprises a voltage detection circuit for measuring the voltage of an assembled battery 20 in which power storage elements 100 are serially connected, a current detection resistor for detecting the current in the assembled battery 20, and a CPU 33 for calculating, inter alia, the amount of energization electricity from continuous charging or continuous discharging of the assembled battery 20. The CPU 33 controls input/output for when the assembled battery 20 is charged/discharged so that ΔSOC, which is the value obtained by dividing the amount of energization electricity by the actual capacity of the assembled battery 20, does not exceed an upper limit ΔSOC.

8 Claims, 13 Drawing Sheets

(58) Field of Classification Search
USPC .......................................................... 702/63
See application file for complete search history.

(56) References Cited

U.S. PATENT DOCUMENTS

| | | | | |
|---|---|---|---|---|
| 2014/0042973 A1* | 2/2014 | Kawahara | ................. | H02J 5/00 |
| | | | | 320/118 |
| 2014/0365150 A1* | 12/2014 | Hahn | ................. | G01R 31/3835 |
| | | | | 702/63 |
| 2018/0113174 A1* | 4/2018 | Furukawa | ........... | H01M 10/486 |
| 2019/0025377 A1* | 1/2019 | Sejima | ................. | H01M 10/482 |
| 2020/0249279 A1* | 8/2020 | Cornelli | ............... | G01R 31/367 |
| 2021/0103000 A1* | 4/2021 | Fujino | .................. | G01R 31/392 |

FOREIGN PATENT DOCUMENTS

| | | | |
|---|---|---|---|
| JP | 2006-352970 A | | 12/2006 |
| JP | 2011-019328 A | | 1/2011 |
| JP | 2013-042598 A | | 2/2013 |
| JP | 2015061505 A | * | 3/2015 |
| JP | 2016-185048 A | | 10/2016 |
| JP | 2019-087423 A | | 6/2019 |
| JP | 2019176637 | * | 10/2019 |
| WO | WO-2018/211824 A1 | | 11/2018 |

OTHER PUBLICATIONS

English translation of JP 20066352970, Dec. 28, 2006. (Year: 2006).*
English translation of JP 2006338944, Dec. 14, 2006. (Year: 2006).*
English translation of JP 2019176637, Oct. 10, 2019. (Year: 2019).*
Extended European Search Report for European Patent Application No. 20856988.9, dated Oct. 24, 2022, (8 pages), European Patent Office, Munich, Germany.
International Searching Authority, International Search Report and Written Opinion for International Application No. PCT/JP2020/032369, dated Oct. 13, 2020, Japan Patent Office, Tokyo, Japan.

* cited by examiner

MANAGEMENT APPARATUS FOR ENERGY STORAGE DEVICE, ENERGY STORAGE APPARATUS, AND INPUT/OUTPUT CONTROL METHOD FOR ENERGY STORAGE DEVICE

CROSS REFERENCE TO RELATED APPLICATIONS

This application is a national stage application, filed under 35 U.S.C. § 371, of International Application No. PCT/JP2020/032369, filed Aug. 27, 2020, which claims priority to Japan Application No. 2019-158285, filed Aug. 30, 2019, the contents of both of which as are hereby incorporated by reference in their entirety.

BACKGROUND

Technical Field

The present invention relates to a management apparatus for an energy storage device, an energy storage apparatus, and an input/output control method for an energy storage device.

Description of Related Art

In a lithium ion battery, it is conventionally known that a phenomenon called a diffusion limitation occurs when a continuous charge-discharge time exceeds a certain time. Therefore, Patent Document JP-A-2006-338944 discloses that when it is detected that the increase amount of the internal resistance of the battery exceeds a predetermined value, the output of the battery is controlled to control the occurrence of the diffusion limitation.

BRIEF SUMMARY

In many cases, lithium ion batteries have been used only to the extent that the diffusion limitation does not occur. However, conditions under which the diffusion limitation occurs have not been studied sufficiently, in other words, the performance of the battery has not been used sufficiently.

Therefore, a method of using the performance of the battery sufficiently by sequentially calculating an allowable output from the state of charge (SOC), temperature, and resistance has been studied. However, even in a case where an allowable output is sequentially calculated, there is a possibility that an allowable output more than the actual allowable output is calculated due to the influence of the diffusion limitation, so that improvement thereof has been desired.

A management apparatus for an energy storage device includes: an electrical quantity calculation unit that calculates an electrical quantity of energization by continuous charge or continuous discharge of an energy storage device; and a control unit. The control unit controls input/output of the energy storage device during charge/discharge such that $\Delta SOC$ does not exceed an upper limit $\Delta SOC$, the $\Delta SOC$ being a value obtained by dividing the electrical quantity of energization by an available capacity of the energy storage device.

With the above configuration, it is possible to prevent the occurrence of a decrease in output during discharge due to an increase in the resistance of the energy storage device associated with the diffusion limitation, and to sufficiently improve the performance of the battery.

DETAILED DESCRIPTION OF VARIOUS EMBODIMENTS

Summary of Present Embodiment

Figure 1:
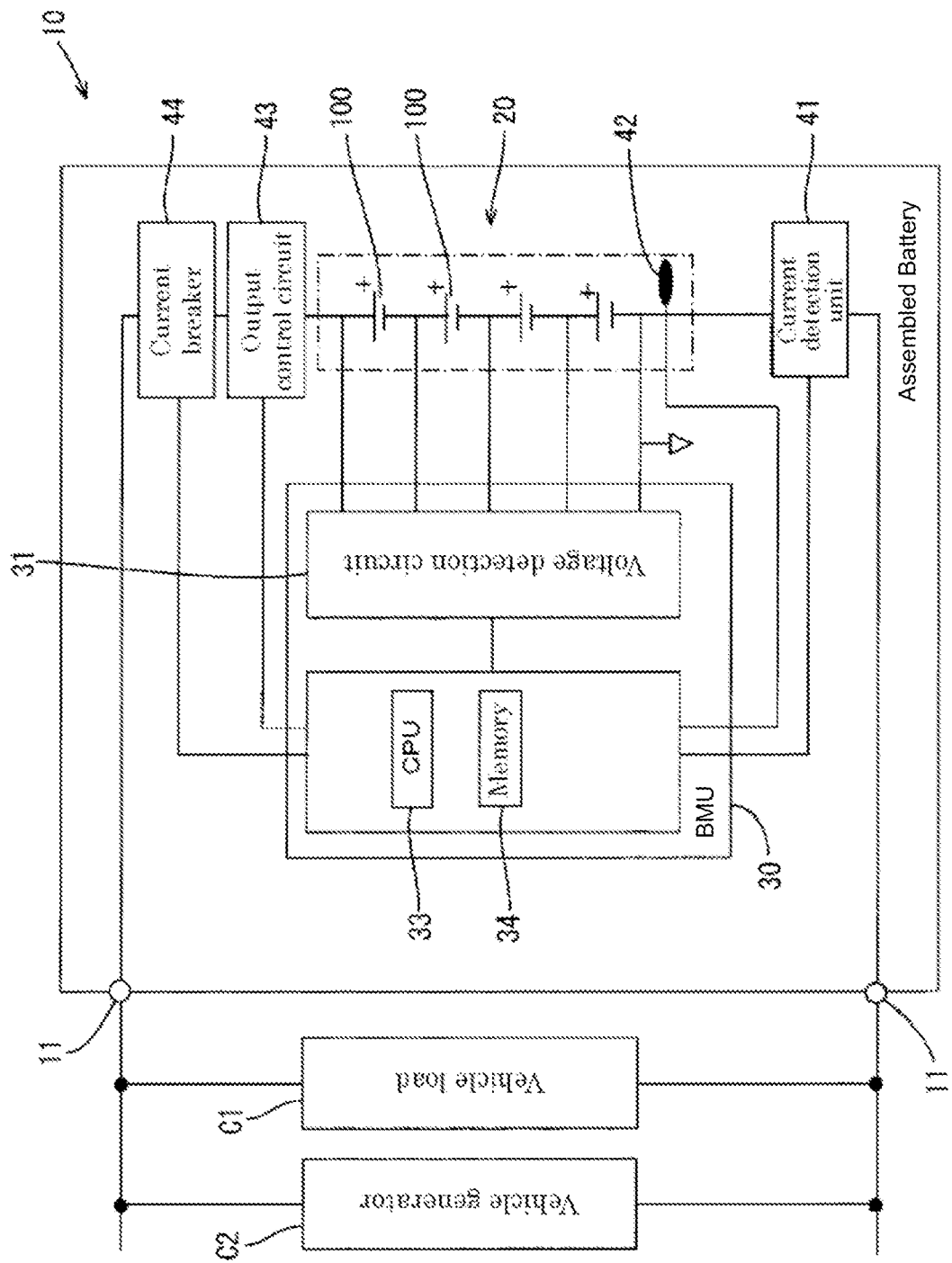
FIG. 1 is a block diagram of an energy storage apparatus according to a first embodiment.

First, an outline of a management apparatus for an energy storage device, an energy storage apparatus, and an input/output control method for an energy storage device will be described.

A management apparatus for an energy storage device includes: an electrical quantity calculation unit that calculates an electrical quantity of energization by continuous charge or continuous discharge of an energy storage device; and a control unit. The control unit controls input or output of the energy storage device during charge or discharge such that ΔSOC does not exceed an upper limit ΔSOC, the ΔSOC being a value obtained by dividing the electrical quantity of energization by an available capacity of the energy storage device.

An energy storage apparatus includes an energy storage device and the management apparatus.

An input/output control method for an energy storage device includes controlling input or output of an energy storage device during charge or discharge such that ΔSOC does not exceed an upper limit ΔSOC, the ΔSOC being a value obtained by dividing an electrical quantity of energization by continuous charge or continuous discharge of an energy storage device by an available capacity.

Here, the available capacity is a capacity with which power can be taken out of the energy storage device in a fully charged state. The electrical quantity of energization is I×T, that is, a product (integral value) of a current and an energization time. The SOC is a ratio of the residual capacity to the available capacity.

The present inventors examined the relationship between use conditions (in particular, an output lower limit voltage) of a lithium ion battery and a diffusion limitation. The present inventors focused on the fact that conventionally, the output lower limit voltage of the battery is often set with a sufficient margin on the safe side, and the battery performance is not used up. The present inventors have found that the diffusion limitation can be prevented by controlling input or output of an energy storage device during charge or discharge such that ΔSOC does not exceed an upper limit ΔSOC, the ΔSOC being a value obtained by dividing an electrical quantity of energization by continuous charge or continuous discharge of an energy storage device by an available capacity.

By controlling the ΔSOC so as not to exceed the upper limit ΔSOC, it is possible to prevent the occurrence of a decrease in output during discharge due to an increase in the resistance of the energy storage device associated with the diffusion limitation, and to sufficiently improve the performance of the battery.

The control unit may control the input or output of the energy storage device during charge or discharge such that the ΔSOC does not exceed the upper limit ΔSOC when the continuous charge or the continuous discharge of the energy storage device is performed over a predetermined time.

The control unit may determine the upper limit ΔSOC based on the state of charge of the energy storage device before continuous charge or continuous discharge.

The present inventors have found that the upper limit ΔSOC depends on the state of charge (SOC) of the energy storage device before continuous charge or continuous discharge. By determining the upper limit ΔSOC based on the state of charge (SOC) of the energy storage device before continuous charge or continuous discharge, it is possible to improve the accuracy of the diffusion limitation prevention as compared to a case where the upper limit ΔSOC is not determined based on the SOC of the energy storage device before continuous charge or continuous discharge.

The control unit may determine the upper limit ΔSOC based on the temperature of the energy storage device before continuous charge or continuous discharge.

The present inventors have found that the upper limit ΔSOC depends on the temperature of the energy storage device before continuous charge or continuous discharge.

By determining the upper limit ΔSOC based on the temperature before continuous charge or continuous discharge of the energy storage apparatus, it is possible to improve the accuracy of the diffusion limitation prevention as compared to a case where the upper limit ΔSOC is not determined based on the temperature.

The energy storage apparatus may include a current breaker that interrupts energization of the energy storage device, and when the ΔSOC exceeds the upper limit ΔSOC, the control unit may perform interruption control of energization of the energy storage device by the current breaker.

When the ΔSOC exceeds the upper limit ΔSOC, the energization of the energy storage device is interrupted by the current breaker, whereby it is possible to prevent the occurrence of the diffusion limitation in the energy storage device.

The energy storage apparatus may include an output controller for reducing the output of the energy storage device, and when the ΔSOC exceeds an output reduction reference value set to be lower than the upper limit ΔSOC, the control unit may perform reduction control of the output of the energy storage device by the output controller.

With the above configuration, the output of the energy storage device can be reduced by the output controller when the ΔSOC exceeds the output reduction reference value set to be lower than the upper limit ΔSOC, so that it is possible to extend a period until the ΔSOC exceeds the upper limit ΔSOC and the energization of the energy storage device is interrupted.

Details of Embodiment

Hereinafter, an embodiment of the present invention will be described with reference to FIGS. 1 to 21.

The energy storage apparatus is, for example, an energy storage apparatus 10 that is mounted on an electric vehicle, or a hybrid vehicle driven by an engine and a motor, and the energy storage apparatus supplies power to a vehicle load C1 mounted on the vehicle and is charged by a vehicle generator (e.g., an alternator) C2.

As illustrated in FIG. 1, the energy storage apparatus 10 includes an assembled battery 20 in which a plurality of energy storage devices 100 are connected in series, a battery management apparatus (an example of an "electrical quantity calculation unit" and a "control unit", hereinafter referred to as a "battery management unit (BMU)") 30 that manages the assembled battery 20, a current detection unit (an example of a "measurement unit") 41, a temperature measurement unit (an example of a "measurement unit") 42, an output control circuit (an example of an "output control unit") 43, a current breaker 44, and an external terminal 11. In the assembled battery 20, a plurality of energy storage devices 100 may be connected in series and in parallel.

The energy storage apparatus 10 may be a 12 V power supply that supplies power to an engine starter and an auxiliary machine. The energy storage apparatus 10 may be a 48 V power supply that assists the vehicle drive and supplies power to an auxiliary machine.

The energy storage device 100 in the present embodiment is a nonaqueous electrolyte secondary battery, specifically a lithium ion battery. The energy storage device 100 is not limited to the lithium ion battery. The energy storage device 100 may be a battery other than the lithium ion battery or may be a capacitor, in which a temporary output decrease similar to that in the lithium ion battery occurs.

Figure 2:
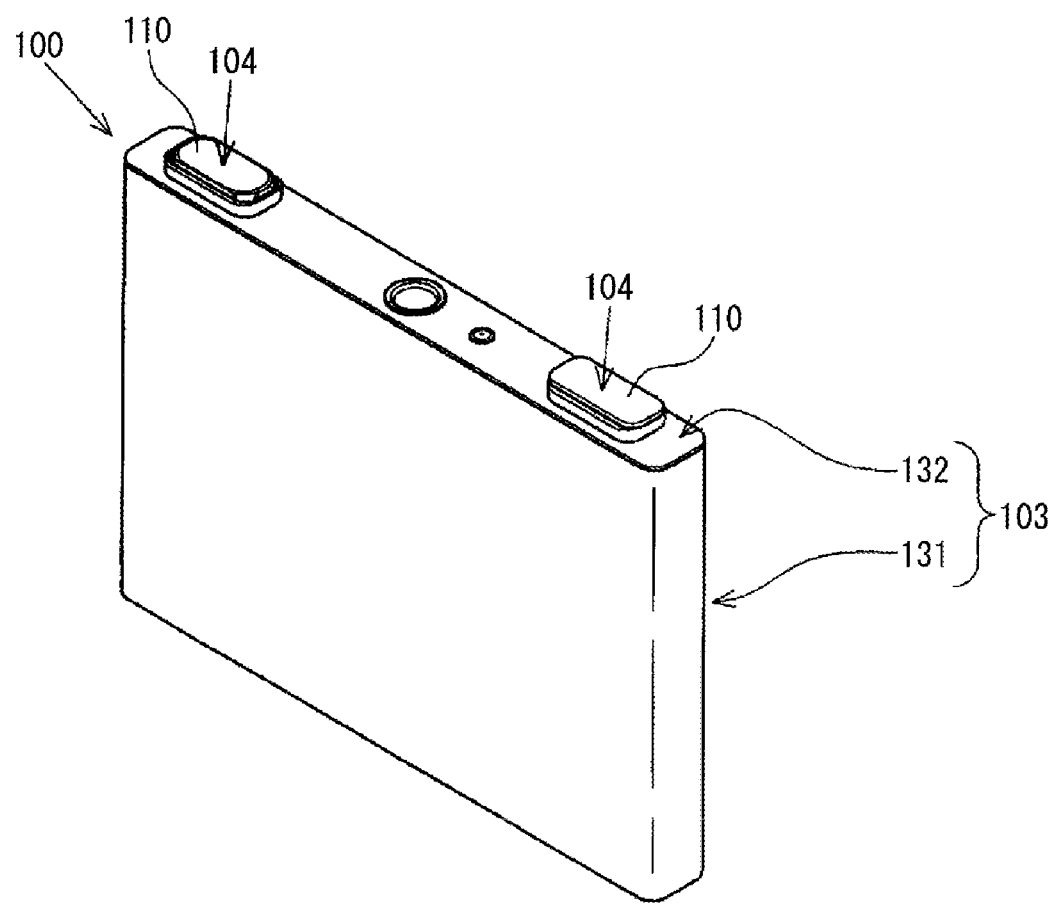
FIG. 2 is a perspective view of an energy storage device.
Figure 3:
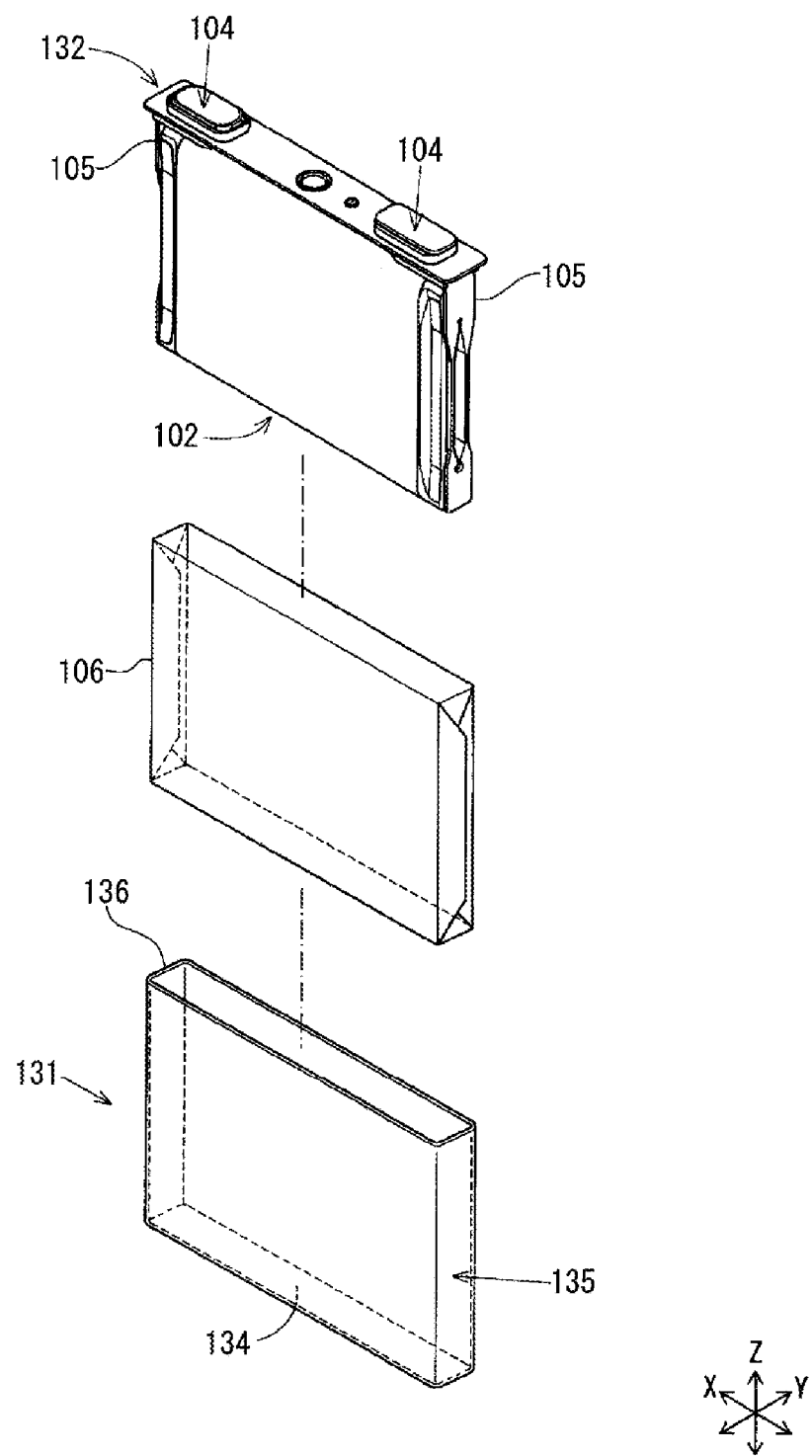
FIG. 3 is an exploded perspective view of the energy storage device.
Figure 4:
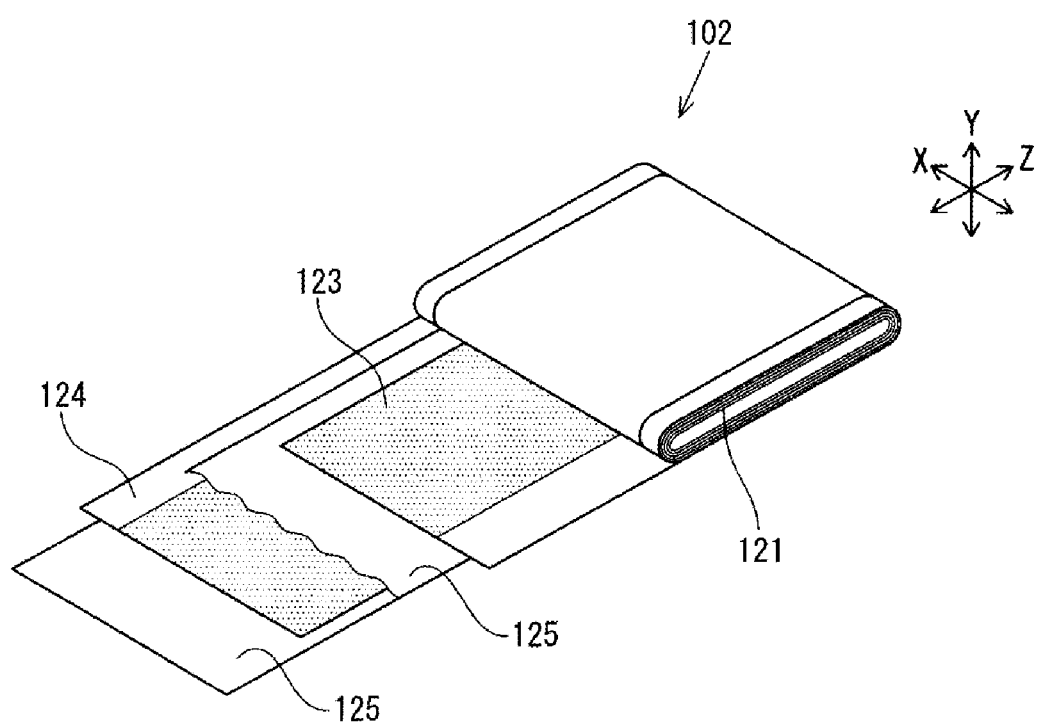
FIG. 4 is a perspective view illustrating an electrode assembly of the energy storage device.

As illustrated in FIG. 2 to FIG. 4, the energy storage device 100 is provided with: an electrode assembly 102 including a positive electrode 123 and a negative electrode 124; a case 103 that houses the electrode assembly 102; and an external terminal 104 disposed outside the case 103. The energy storage device 100 includes a current collector 105 that conducts the electrode assembly 102 and the external terminal 104.

The electrode assembly 102 includes a winding core 121, and the positive electrode 123 and the negative electrode 124 wound around the winding core 121 in a state of being insulated from each other. The winding core may not be provided. In the electrode assembly 102, lithium ions move between the positive electrode 123 and the negative electrode 124, whereby the energy storage device 100 is charged and discharged.

The positive electrode 123 includes a metal foil and a positive active material layer formed on the metal foil. The metal foil has a strip shape. The metal foil is, for example, aluminum foil.

As a positive active material, it is preferable to use a layered lithium transition metal oxide or the like such as $Li_{1+x}M_{1-y}O_2$, like $LiN_{1/3}Co_{1/3}Mn_{1/3}O_2$ (M represents one or more transition metal elements selected from Fe, Ni, Mn, Co, and the like, $0 \leq x < 1/3$, $0 \leq y < 1/3$). As the positive active material, a spinel-type lithium-manganese oxide such as $LiMn_2O_4$ or $LiMn_{1.5}Ni_{0.5}O_4$, an olivine-type positive active material such as $LiFePO_4$, or the like and the layered lithium transition metal oxide described above may be mixed and used. The positive active material is not limited thereto.

The negative electrode 124 includes a metal foil and a negative active material layer formed on the metal foil. The metal foil has a strip shape. The metal foil is, for example, a copper foil.

The negative active material in the present embodiment is a carbon material. Specifically, the negative active material may be any one of graphite, graphitizable carbon, non-graphitizable carbon, and the like.

The positive electrode 123 and the negative electrode 124 configured as described above are wound in a state of being insulated by a separator 125. That is, in the electrode assembly 102 of the present embodiment, the positive electrode 123, the negative electrode 124, and the separator 125 are wound in a stacked state. The separator 125 is an insulating member. The separator 125 is disposed between the positive electrode 123 and the negative electrode 124, whereby the positive electrode 123 and the negative electrode 124 are insulated from each other in the electrode assembly 102. The separator 125 holds an electrolyte solution in the case 103, whereby lithium ions move between the positive electrode 123 and the negative electrode 124 alternately stacked with the separator 125 interposed therebetween during the charge and discharge of the energy storage device 100.

The electrode assembly 102 is not limited to a wound type. The electrode assembly 102 may be of a stack type in which a plate-shaped positive electrode, a separator, and a plate-shaped negative electrode are stacked.

The case 103 includes a case body 131 having an opening, and a lid plate 132 that closes the opening of the case body 131. The case 103 is formed by joining the opening peripheral edge 136 of the case body 131 and the peripheral edge of the lid plate 132 in a superimposed state. The case 103 has an internal space defined by the case body 131 and the lid plate 132. The case 103 accommodates the electrolyte solution in the internal space together with the electrode assembly 102, the current collector 105, and the like.

The case body 131 includes a rectangular plate-shaped closed portion 134 and a rectangular tube-shaped barrel portion 135 connected to a peripheral edge of the closed portion 134. The case body 131 has a rectangular tube shape (i.e., a bottomed rectangular tube shape) in which one end in the opening direction (Z-axis direction) is closed.

The lid plate 132 is a plate-shaped member that closes the opening of the case body 131. Specifically, the lid plate 132 has a contour shape corresponding to the opening peripheral edge 136 of the case body 131. That is, the lid plate 132 is a rectangular plate member. In the lid plate 132, the peripheral edge of the lid plate 132 is superimposed on the opening peripheral edge 136 of the case body 131 so as to close the opening of the case body 131. Hereinafter, as illustrated in FIG. 2, a long side direction of the lid plate 132 is an X-axis direction in Cartesian coordinates, a short side direction of the lid plate 132 is a Y-axis direction in Cartesian coordinates, and a normal direction of the lid plate 132 is a Z-axis direction in Cartesian coordinates. An electrode assembly and an outer case that houses the electrode assembly and the current collector is not limited to the prismatic case 103 but may be, for example, a pouch (laminated outer case) including a metal layer and a resin layer.

The external terminal 104 is a planar portion 110 electrically connected to an external terminal of another energy storage device, external equipment, or the like. The external terminal 104 is formed of a conductive member. For example, the external terminal 104 is formed of a metal material having high weldability, which is an aluminum-based metal material, such as aluminum or an aluminum alloy, or a copper-based metal material, such as copper or a copper alloy.

The current collector 105 is disposed in the case 103 and is electrically connected directly or indirectly to the electrode assembly 102. The current collector 105 is formed of a conductive member and is disposed along the inner surface of the case 103. The current collector 105 may not be provided. The electrode assembly 102 may be directly connected to the external terminal 104.

The energy storage device 100 includes an insulating member 106 that insulates the electrode assembly 102 from the case 103. The insulating member 106 of the present embodiment has a bag shape. The insulating member 106 is disposed between the case 103 (to be more specific, the case body 131) and the electrode assembly 102. The insulating member 106 of the present embodiment is formed of, for example, a resin such as polypropylene or polyphenylene sulfide. In the energy storage device 100 of the present embodiment, the electrode assembly 102 (the electrode assembly 102 and the current collector 105) in a state of being accommodated in the bag-shaped insulating member 106 is accommodated in the case 103. The insulating member 106 may not be provided.

The external terminals 104 of the respective energy storage devices 100 are connected in series by, for example, a busbar or the like to constitute the assembled battery 20.

The current detection unit 41 may be a current detection resistor (e.g., shunt resistor). By detecting the potential difference between both ends of the current detection resistor, a current flowing through the assembled battery 20 can be detected. The temperature measurement unit 42 is a contact type or a non-contact type and measures the temperature [° C.] of the assembled battery 20. The temperature measurement unit 42 may measure a temperature in the vicinity of the assembled battery 20 or may measure a temperature of one specific energy storage device or each of a plurality of energy storage devices. As illustrated in FIG. 1, the current detection unit 41 and the temperature measurement unit 42 are connected to the BMU 30, and the detection value of the current detection unit 41 and the detection value of the temperature measurement unit 42 are taken into the BMU 30.

The output control circuit 43 controls the output current or output voltage of the assembled battery 20 in response to a command from the BMU 30.

The current breaker 44 is, for example, a semiconductor switch such as a field-effect transistor (FET) or a relay and is driven in response to a command from the BMU 30 to interrupt the current between the assembled battery 20 and the vehicle load C1 and between the assembled battery 20 and the vehicle generator C2.

As illustrated in FIG. 1, the BMU 30 includes a voltage detection circuit (an example of a "measurement unit") 31, a CPU (an example of a "control unit") 33 that is a central processing unit, and a memory 34, and the BMU 30 is driven by receiving power supply from the assembled battery 20.

The voltage detection circuit 31 is connected to both ends of each energy storage device 100 via a voltage detection line and measures the cell voltage of each energy storage device 100 and the battery voltage of the assembled battery 20 (the total voltage of the plurality of energy storage devices 100) in response to an instruction from the CPU 33. The voltage detection circuit 31 may measure only the total voltage of the assembled battery 20.

The memory 34 is a nonvolatile memory such as flash memory or an electrically erasable programmable read-only memory (EEPROM). The memory 34 stores various programs for managing each energy storage device 100 or the assembled battery 20, data necessary for executing the various programs, for example, a correlation between the open-circuit voltage (OCV) and SOC of the assembled battery 20, an initial available capacity of the assembled battery 20, and the like.

Figure 5:
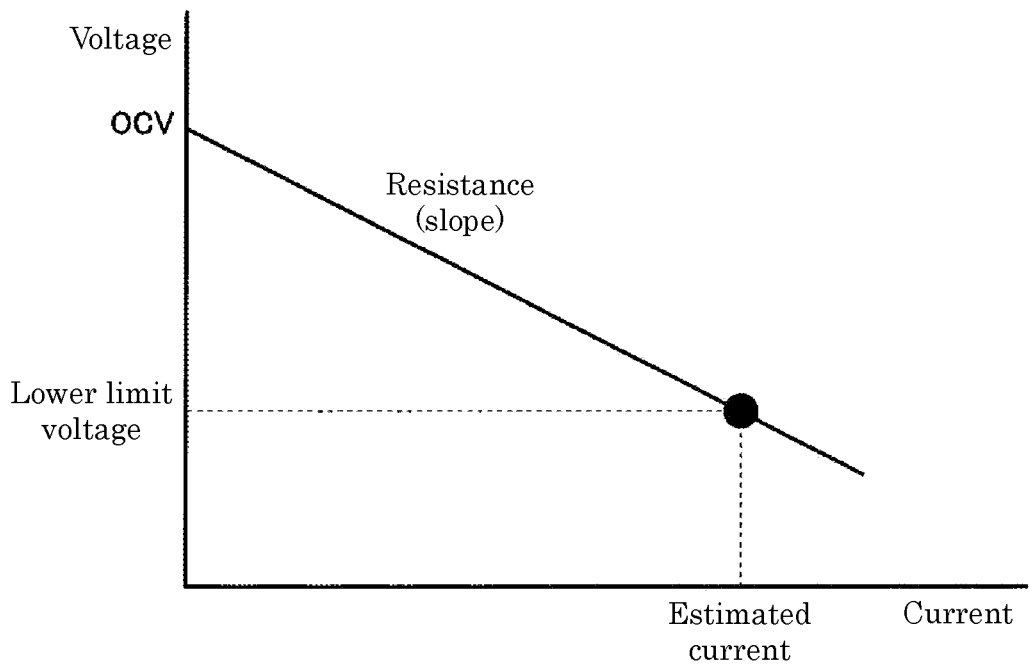
FIG. 5 is a graph illustrating a correlation between a voltage and a current during the discharge of the energy storage device or an assembled battery.
Figure 6:
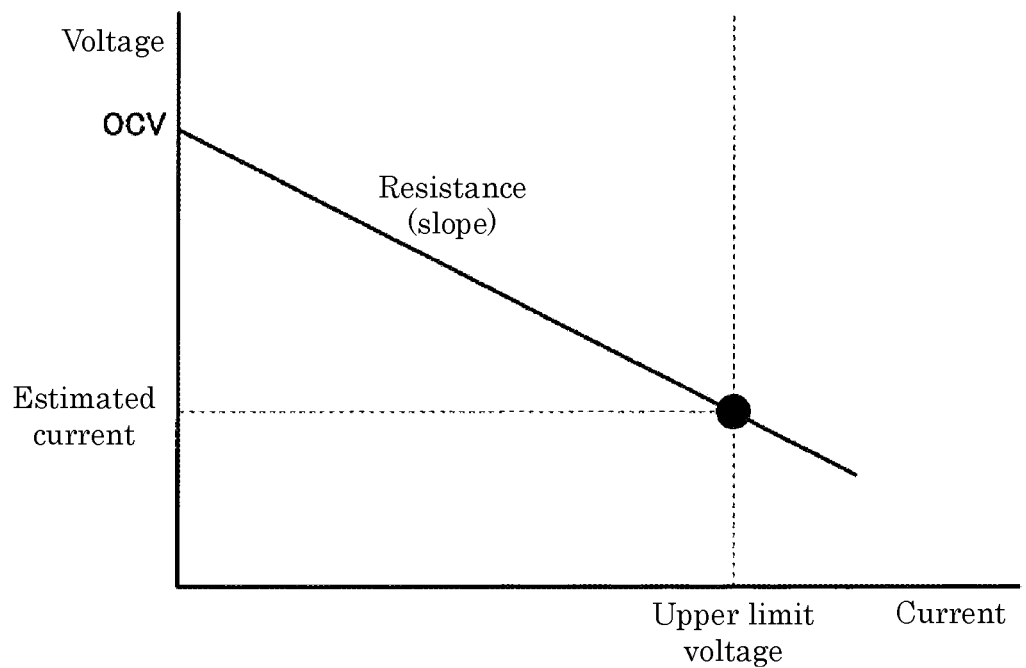
FIG. 6 is a graph illustrating a correlation between a voltage and a current during the charge of the energy storage device or the assembled battery.

The CPU 33 detects the voltage, current, temperature, and the like of the assembled battery 20 from the received various signals, and monitors and controls each unit based on the program read from the memory 34. The CPU 33 calculates the SOC from the voltage based on the OCV-SOC correlation and calculates the electrical quantity of energization based on the amount of change in the SOC. As illustrated in FIGS. 5 and 6, there is a linear correlation between the voltage and the current, and the CPU 33 can obtain internal resistance R and the allowable output of the assembled battery 20 from the slope of the correlation.

Specifically, when the voltage reaches the lower limit voltage during discharge, as illustrated in FIG. 5, the estimated current at the lower limit voltage is referred to in the correlation between the voltage and the current, and the lower limit voltage and the estimated current are multiplied to calculate the allowable output at that time. When the upper limit current is reached during charge, as illustrated in FIG. 6, the estimated voltage at the upper limit current is referred to in the correlation between the voltage and the current, and the upper limit current and the estimated voltage are multiplied to calculate the allowable input at that time.

The CPU 33 can estimate the maximum allowable input/output during charge and discharge in the assembled battery 20 by obtaining the estimated current and the estimated voltage on the basis of the internal resistance and the lower limit voltage and on the basis of the internal resistance and the upper limit current, and outputs a command to the output control circuit 43 in accordance with the maximum allowable output.

In the assembled battery 20, when continuous charge and discharge exceeds a certain time, a phenomenon called a diffusion limitation occurs in each energy storage device 100. Although there is a method of using the assembled battery 20 only in a range in which the diffusion limitation does not occur, in such a case, the performance of the assembled battery 20 cannot be sufficiently used because the lower limit value of the output in the assembled battery 20 is set high.

Figure 7:
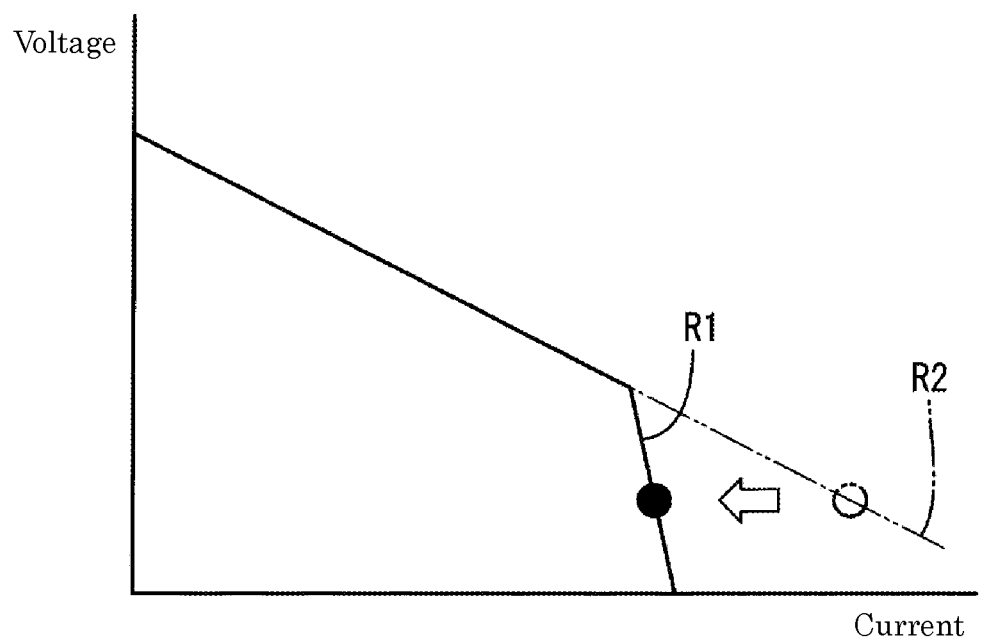
FIG. 7 is a graph illustrating a correlation between a voltage and a current representing a change in the internal resistance of the energy storage device or the assembled battery.

Then, as illustrated in FIG. 7, there is considered a method of sufficiently using the performance of the assembled battery 20 by sequentially calculating the allowable output (the relationship between the voltage and the current) of the assembled battery 20 from the state of charge (SOC), the temperature, the internal resistance, and the like. In the graph illustrated in FIG. 7, the Y-axis represents voltage (closed-circuit voltage (CCV)), and the X-axis represents current.

When the diffusion limitation occurs, the output of the assembled battery 20 rapidly decreases as indicated by a solid line R1 in FIG. 7. As indicated by a two-dot chain line R2 in FIG. 7, when an allowable output higher than the actual level of the assembled battery 20 is calculated, the behavior of the charge-discharge system becomes unstable.

The present inventors have found that the assembled battery 20 can be prevented from reaching the diffusion limitation by performing continuous charge or continuous discharge on the assembled battery 20 to determine in advance the upper limit value (hereinafter referred to as "upper limit ΔSOC") of the ΔSOC based on the voltage value and the current value when the diffusion limitation is generated and performing control such that the ΔSOC determined based on the voltage value and the current value at the time of use of the assembled battery 20 does not exceed the upper limit ΔSOC. Here, the continuous charge and the continuous discharge refer to that charge is continuously performed or discharge is continuously performed, and for example, in a case where the discharge is switched to charge halfway or in a case where the discharge is suspended and the discharge is started again, the case is excluded from the continuous discharge.

Figure 8:
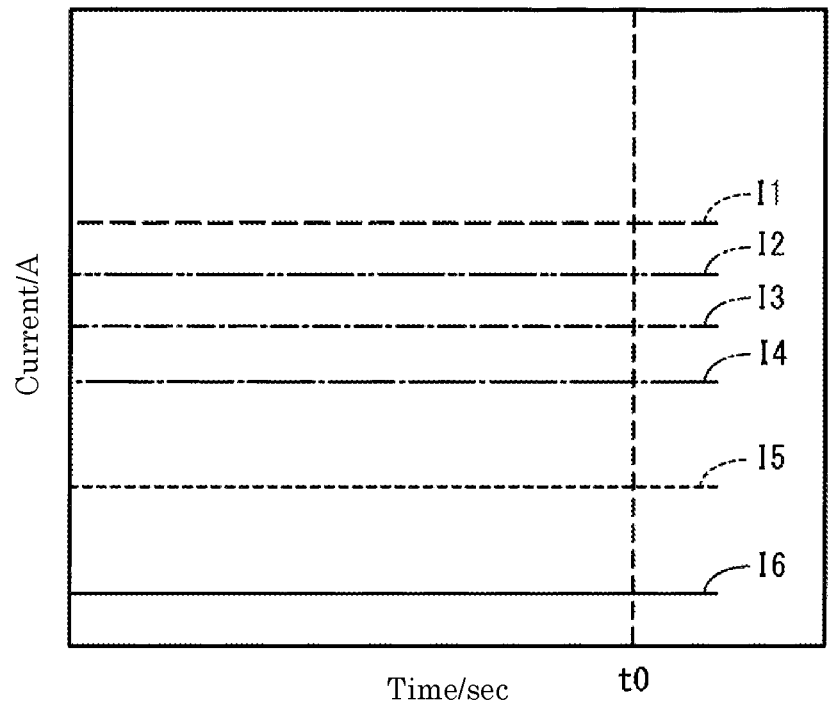
FIG. 8 is a graph illustrating an example of temporal transition of a current in an energy storage device or an assembled battery at 0° C. and an SOC of 15%.
Figure 9:
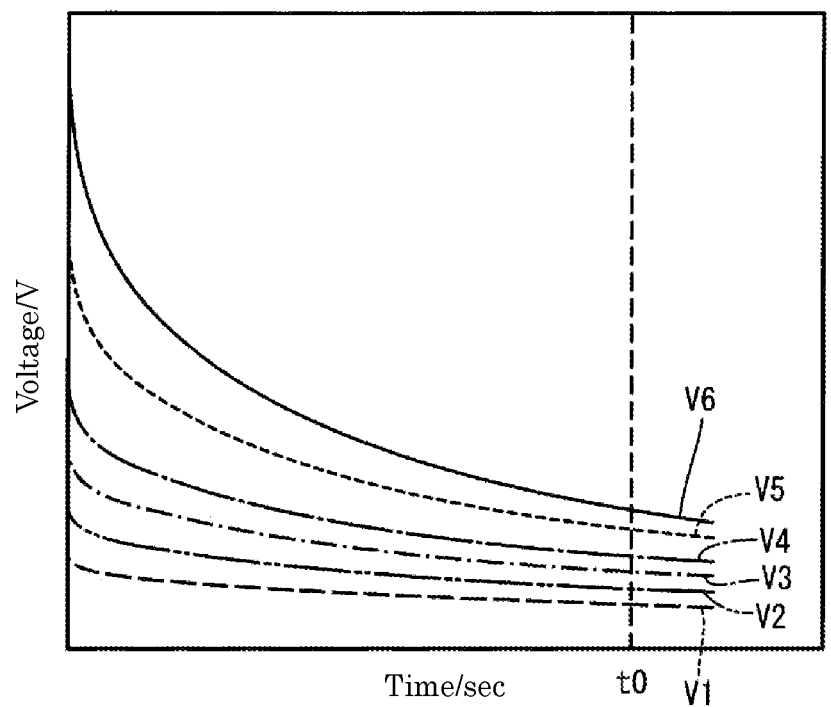
FIG. 9 is a graph illustrating an example of temporal transition of a voltage in the energy storage device or the assembled battery at 0° C. and an SOC of 15%.

For example, the assembled battery 20 having an SOC of 15% and a temperature of 0° C. is continuously discharged under a plurality of conditions, and voltage behavior at each of a plurality of predetermined currents of the battery module as illustrated in FIGS. 8 and 9 is measured. In the graph illustrated in FIG. 8, the Y-axis represents the current [A] of the assembled battery 20, the X-axis represents elapsed time [sec], the graph illustrated in FIG. 9 is a graph corresponding to FIG. 8, the Y-axis represents the voltage [V] of the assembled battery 20, and the X-axis represents elapsed time [sec].

Figure 10:
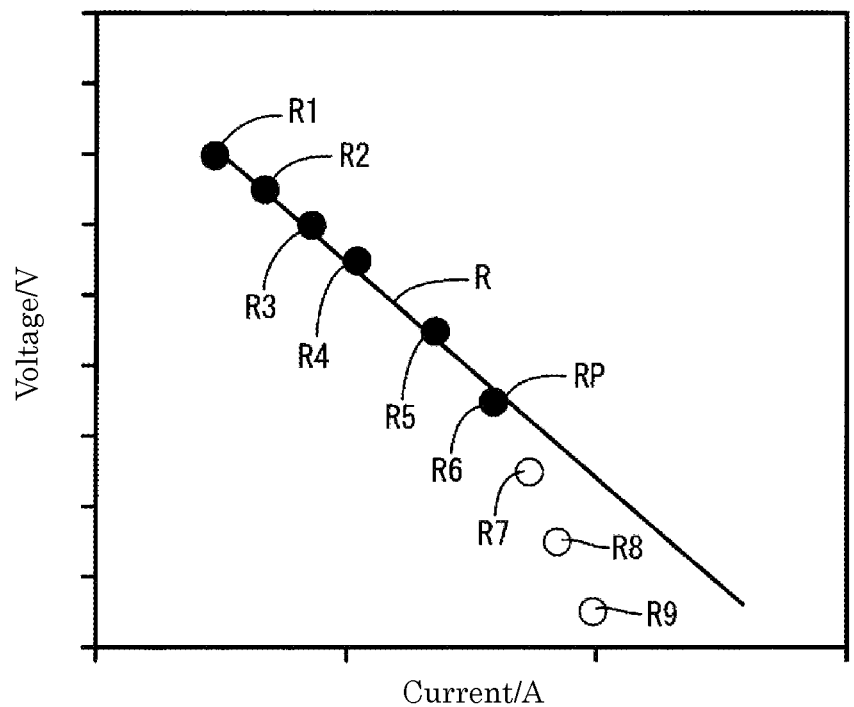
FIG. 10 is a graph illustrating a correlation between a voltage and a current in the energy storage device or the assembled battery at 0° C. and an SOC of 15%.

Based on current values I1, I2 . . . , In and respective voltages V1, V2 . . . , Vn at the time when predetermined time t0 has elapsed since the start of the continuous discharge in the graphs of the voltage/current behavior illustrated in FIGS. 8 and 9, the voltage-current relationship (the output of the assembled battery) as illustrated in FIG. 10 is obtained, and internal resistances R1, R2 . . . , Rn corresponding to respective conditions can be obtained. In the graph illustrated in FIG. 10, the Y-axis represents voltage [V] and the X-axis represents current [A].

As shown in FIG. 10, the internal resistance R of the energy storage device rapidly increases after a specific condition RP (the diffusion limitation occurs in the energy storage device 100), and the output during discharge decreases rapidly.

Figure 11:
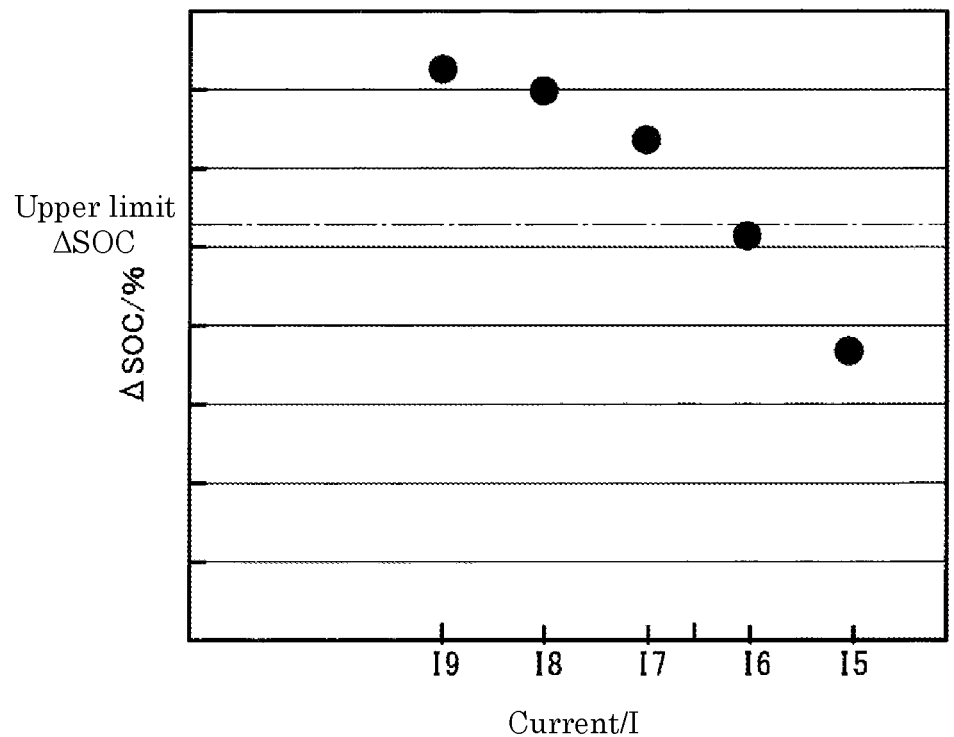
FIG. 11 is a graph illustrating a correlation between $\Delta SOC$ and a current in the energy storage device or the assembled battery at 0° C. and an SOC of 15%.
Figure 12:
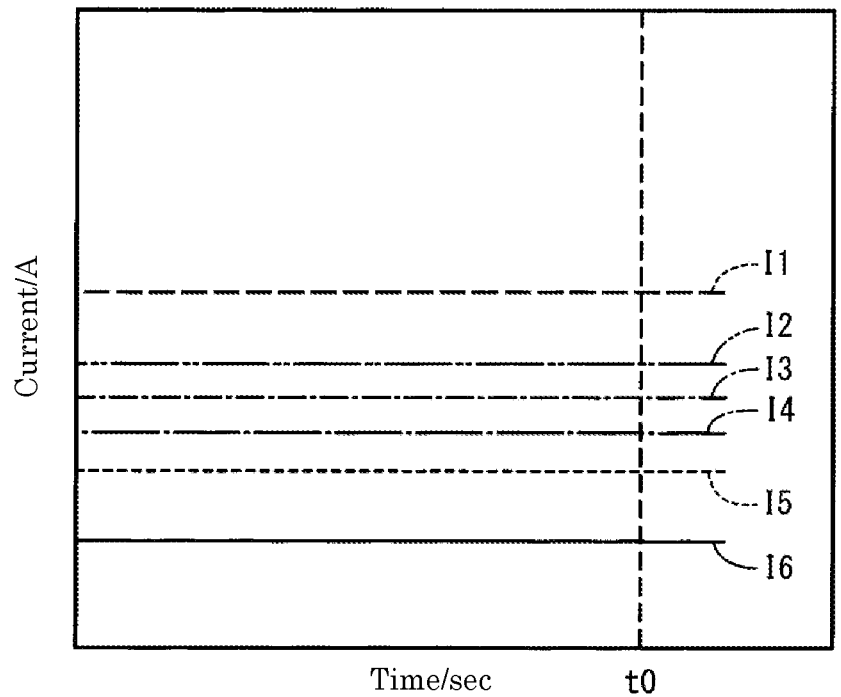
FIG. 12 is a graph illustrating a temporal transition of a current in an energy storage device or an assembled battery at −30° C. and an SOC of 45%.
Figure 13:
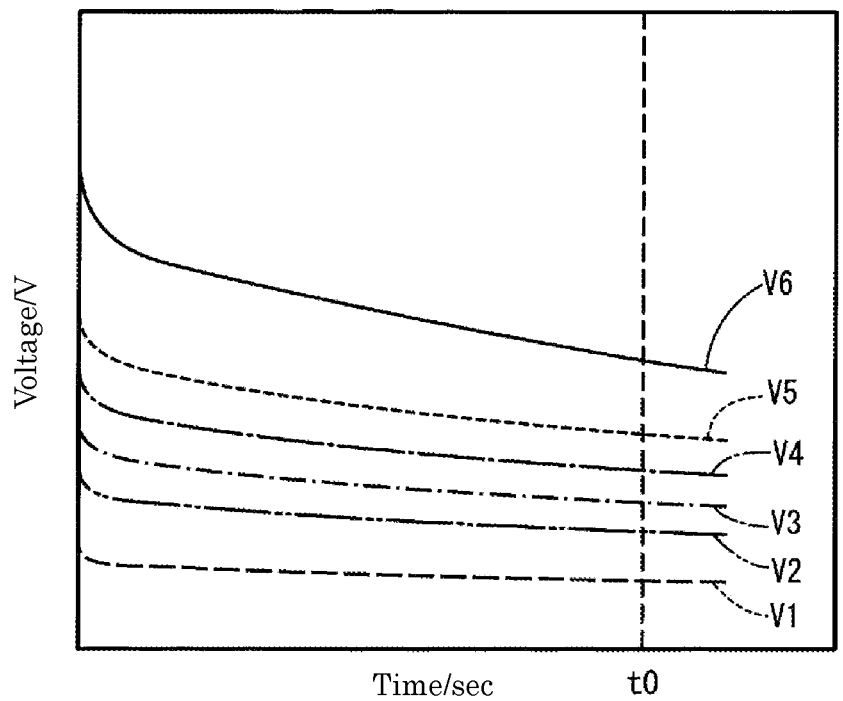
FIG. 13 is a graph illustrating a temporal transition of a voltage in the energy storage device or the assembled battery at −30° C. and an SOC of 45%.

The electrical quantity of energization during discharge is obtained using a current integration method, and the electrical quantity of energization is divided by the available capacity of the assembled battery 20 to calculate the ΔSOC (electrical quantity of energization/available capacity), whereby the relationship between the ΔSOC and the voltage as illustrated in FIG. 11 can be obtained. The available capacity is a capacity with which power can be taken out of the assembled battery in a fully charged state. In the graph of FIG. 11, the Y-axis represents ΔSOC [%], and the X-axis represents voltage [V].

By comparing the result of the diffusion limitation obtained from the voltage-current relationship with the relationship between the ΔSOC and the current, as illustrated in FIG. 11, it is possible to determine the upper limit ΔSOC that is the upper limit of the ΔSOC at which the diffusion limitation occurs.

Specifically, by comparing each voltage in FIG. 11 when the diffusion limitation is reached with the relationship between the ΔSOC and the current in FIG. 11, the upper limit ΔSOC in FIG. 10 can be determined.

The ΔSOC is prevented from exceeding the upper limit ΔSOC when the assembled battery 20 is continuously discharged, whereby the occurrence of the diffusion limitation in the assembled battery 20 can be prevented.

The present inventors have found that the upper limit ΔSOC depends on an initial SOC value, which is an SOC before continuous discharge or continuous charge, and a temperature of the energy storage device before continuous discharge or continuous charge.

For example, the assembled battery 20 having an SOC of 45% and a temperature of −30° C. is continuously discharged (cf. FIGS. 12 and 13), and the voltage-current relationship (cf. FIG. 14) and the relationship between the ΔSOC and the current (FIG. 15) at that time are obtained. The present inventors have found that, by obtaining the upper limit ΔSOC in the plurality of initial SOC values, as illustrated in FIG. 16, in the relationship between the initial SOC value and the upper limit ΔSOC with the X-axis as SOC [%] and the Y-axis as the upper limit ΔSOC [%], the upper limit ΔSOC also tends to increase as the initial SOC value increases. The present inventors have found that the upper limit ΔSOC of the temperature of the assembled battery 20 also tends to increase as the temperature increases, similarly to the initial SOC value. Data indicating the correlation between the initial SOC value and the upper limit ΔSOC for each temperature of the assembled battery 20 (the graph of FIG. 16) may be stored in the memory 34.

Figure 17:
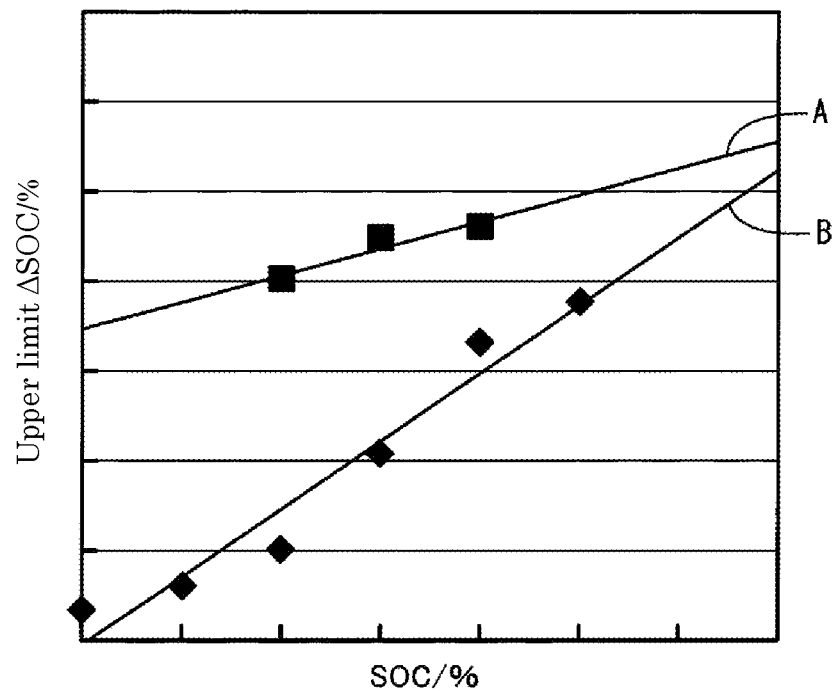
FIG. 17 is a graph illustrating a correlation between the upper limit $\Delta SOC$ and the SOC in different types of batteries.

The present inventors have found that even in different types of assembled batteries (assembled battery A and assembled battery B) obtained by changing the thickness of the plate and the porosities of the plate and the separator in the energy storage device, the upper limit ΔSOC also tends to increase as the initial SOC value increases, as illustrated in FIG. 17.

The upper limit ΔSOC of the assembled battery 20 in the continuous charge can be obtained by the same method as in the case of the discharge, and hence the description thereof is omitted.

Figure 14:
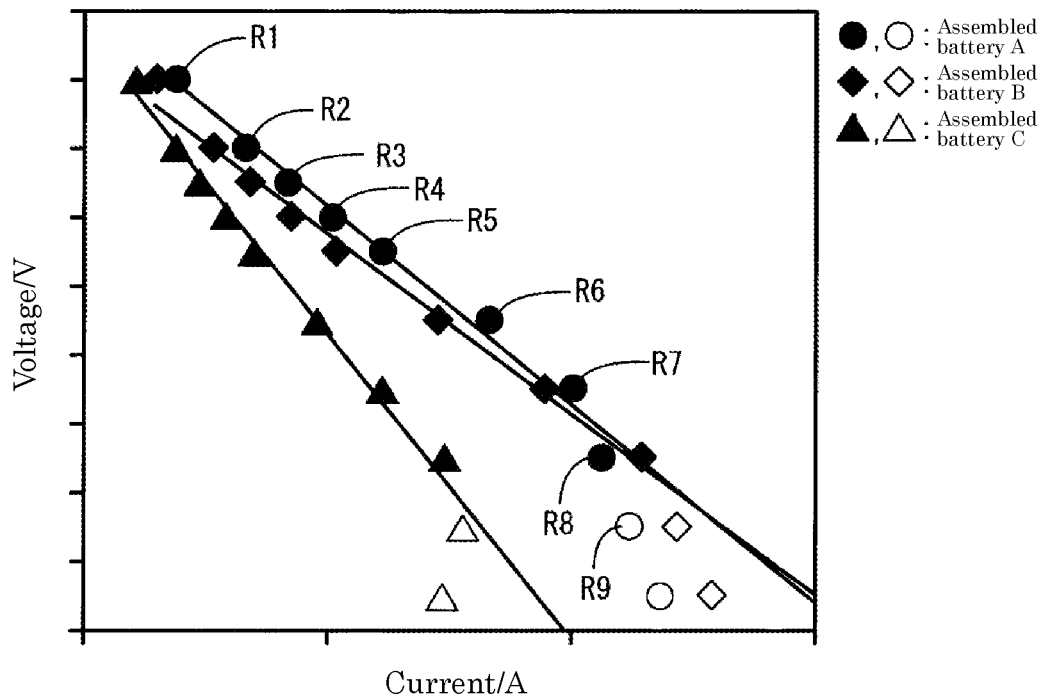
FIG. 14 is a graph illustrating a correlation between a voltage and a current in the energy storage device or the assembled battery at −30° C. and an SOC of 45%.
Figure 15:
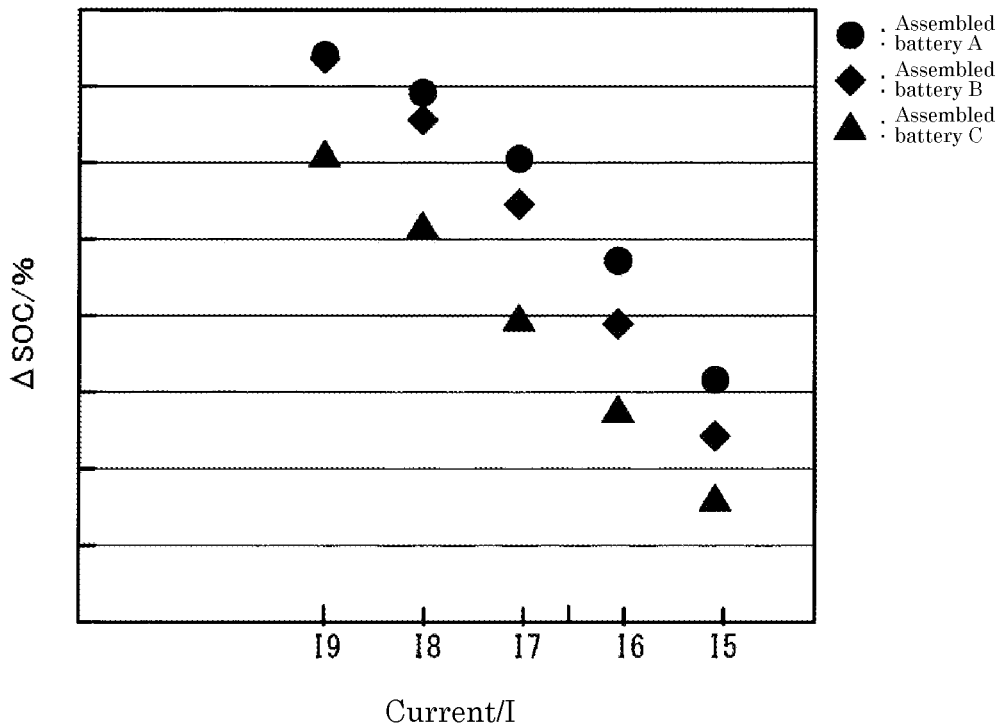
FIG. 15 is a graph illustrating a correlation between $\Delta SOC$ and a current in the energy storage device or the assembled battery at −30° C. and an SOC of 45%.
Figure 16:
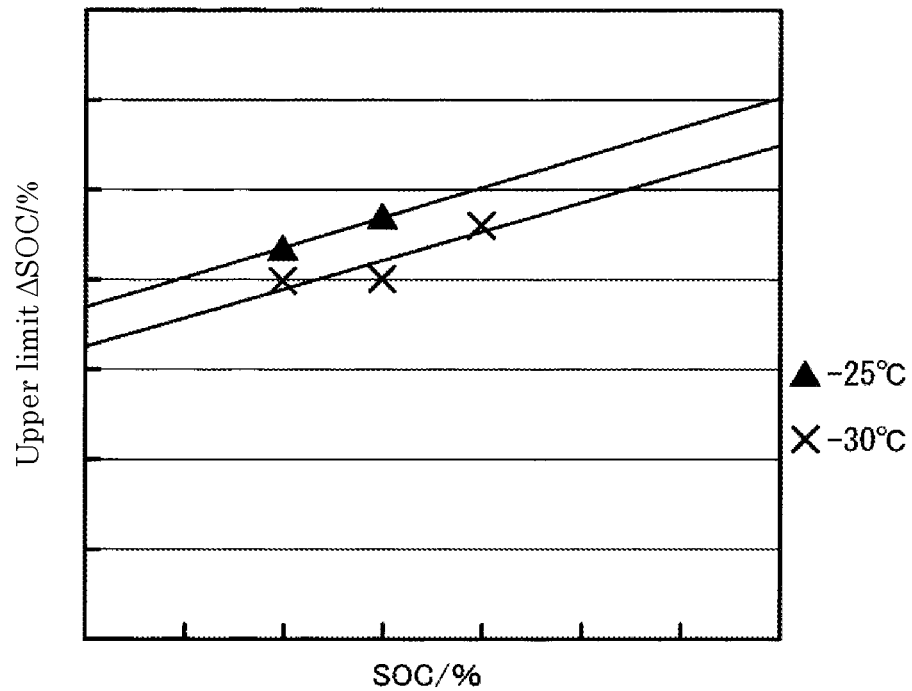
FIG. 16 is a graph illustrating a correlation between an upper limit $\Delta SOC$ and an SOC at different temperatures.

The square dots illustrated in FIGS. 14 and 15 are the result of the assembled battery of the same type as the round dots, and the triangle dots are the result when the assembled battery of the same type as the round dots is left for a certain period (several hundred days or more) and deteriorates over time, and the upper limit ΔSOC at this time has the same tendency both before and after the deterioration of the assembled battery 20. That is, in the case of the same type of assembled battery, the occurrence of the diffusion limitation in the assembled battery 20 can be prevented by applying the upper limit ΔSOC in any of the assembled batteries. The available capacity at the time of obtaining the upper limit ΔSOC of the aged assembled battery can be obtained by, for example, a law (root side) in which the capacity decreases based on the cumulative time of actual use or the cycle number of the assembled battery.

Figure 18:
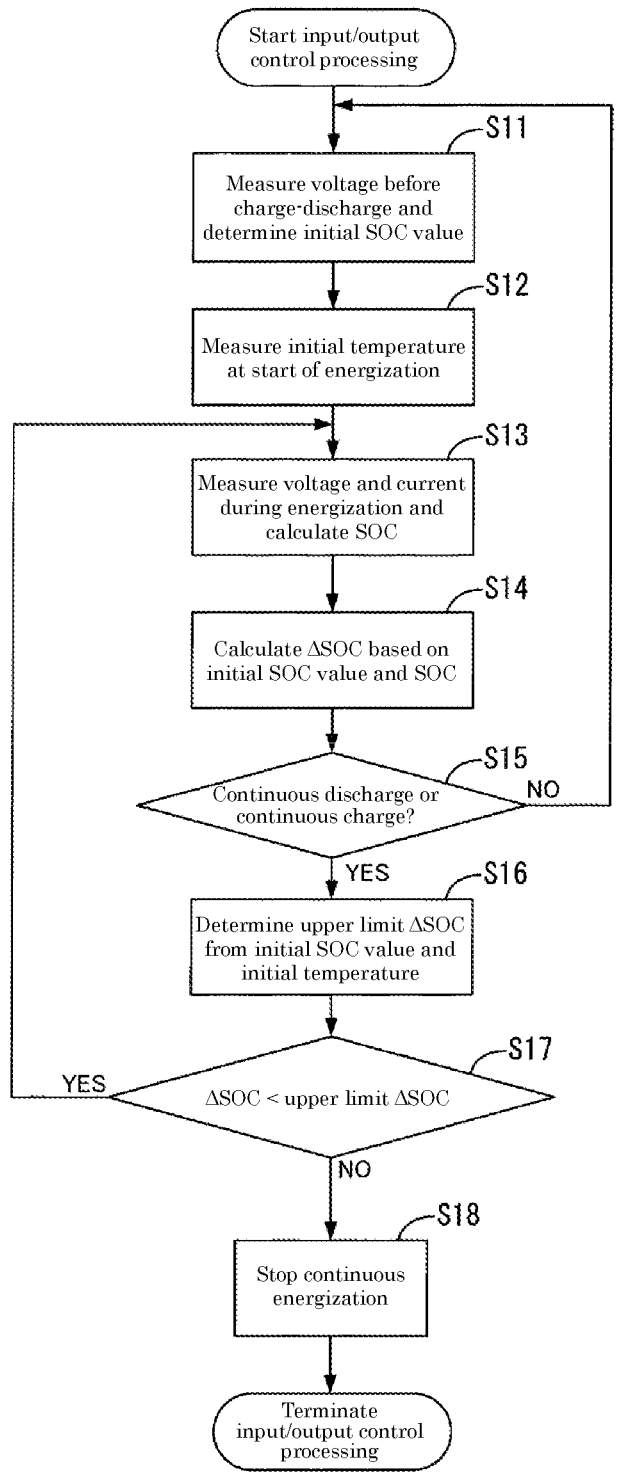
FIG. 18 is a flowchart illustrating input/output control processing according to the first embodiment.

In the present embodiment, in order to avoid the occurrence of the diffusion limitation in the assembled battery 20, the CPU 33 performs input/output control during the charge and discharge of the assembled battery 20 as illustrated in FIG. 18.

In the input/output control processing, for example, the open-circuit voltage (OCV) of the assembled battery 20 is detected by periodically giving a command to the voltage detection circuit 31, and an immediately preceding open-circuit voltage (OCV) is obtained by turning on an ignition of a vehicle and starting power supply from the assembled battery 20 to a vehicle load. Then, based on the detected OCV, an initial SOC value is obtained from the OCV-SOC correspondence relationship stored in the memory 34 (S11). The CPU 33 detects the initial temperature of the assembled battery 20 when the ignition is turned on in accordance with a signal from the temperature measurement unit 42 (S12).

Next, after the start of the energization by the charge and discharge of the assembled battery 20, the CPU 33 calculates the current value by using the output from the current detection unit 41, detects the closed-circuit voltage (CCV) of the assembled battery 20 from the voltage detection circuit 31, and calculates the SOC of the assembled battery 20 after the start of the energization (S13). The SOC is a ratio of the residual capacity to the available capacity of the assembled battery 20. The SOC may be obtained from the current value by the current integration method or may be obtained from the closed-circuit voltage by using the correlation of the CCV-SOC.

When the SOC is calculated, the CPU 33 calculates the electrical quantity of energization based on the SOC and the initial SOC value and calculates the ΔSOC by dividing the electrical quantity of energization by the available capacity stored in the memory 34 (S14). The electrical quantity of energization may be calculated from an integrated value of currents measured after the start of the energization.

Next, the CPU 33 determines whether the energization at the time of calculating the ΔSOC is due to continuous charge or continuous discharge based on a signal from the current detection unit 41 (S15), and when the energization is not due to continuous charge or continuous discharge (S15: NO), the CPU 33 determines that there is no possibility of reaching the diffusion limitation and returns the processing to S11.

On the other hand, when the energization until the SOC is calculated from the initial SOC value is the continuous charge or the continuous discharge (S15: YES), the CPU 33 determines the upper limit ΔSOC matching the conditions of the initial SOC value and the initial temperature of the assembled battery 20 (S16). The upper limit SOC may be determined from only one condition of the initial SOC value and the initial temperature of the assembled battery 20.

Next, the CPU 33 compares the upper limit ΔSOC determined in S16 with the ΔSOC (S17), and when the ΔSOC is smaller than the upper limit ΔSOC (S16: YES), the CPU 33 determines that continuous energization can be continued without generating a diffusion limitation and returns the processing to S12.

On the other hand, when the ΔSOC is not smaller than the upper limit ΔSOC (S16: NO), a command is given to the current breaker 44 to interrupt the energization by the current breaker 44, thereby stopping the continuous energization between the assembled battery 20 and the vehicle generator C2 and between the assembled battery 20 and the vehicle load C1 (S18).

As described above, according to the energy storage apparatus 10 of the present embodiment, although the assembled battery 20 can be used up to an output limitation where the diffusion limitation occurs in the assembled battery 20, the continuous discharge from the assembled battery 20 to the vehicle load C1 can be interrupted immediately before the diffusion limitation is reached, and the diffusion limitation in the assembled battery 20 can be prevented, so that a rapid decrease in the output of the assembled battery 20 can be prevented.

According to the present embodiment, since the CPU 33 determines the upper limit $\Delta$SOC in accordance with the SOC and the temperature before the continuous charge or continuous discharge of the assembled battery 20, it is possible to enhance the accuracy of the diffusion limitation prevention in the assembled battery 20.

Second Embodiment

Figure 19:
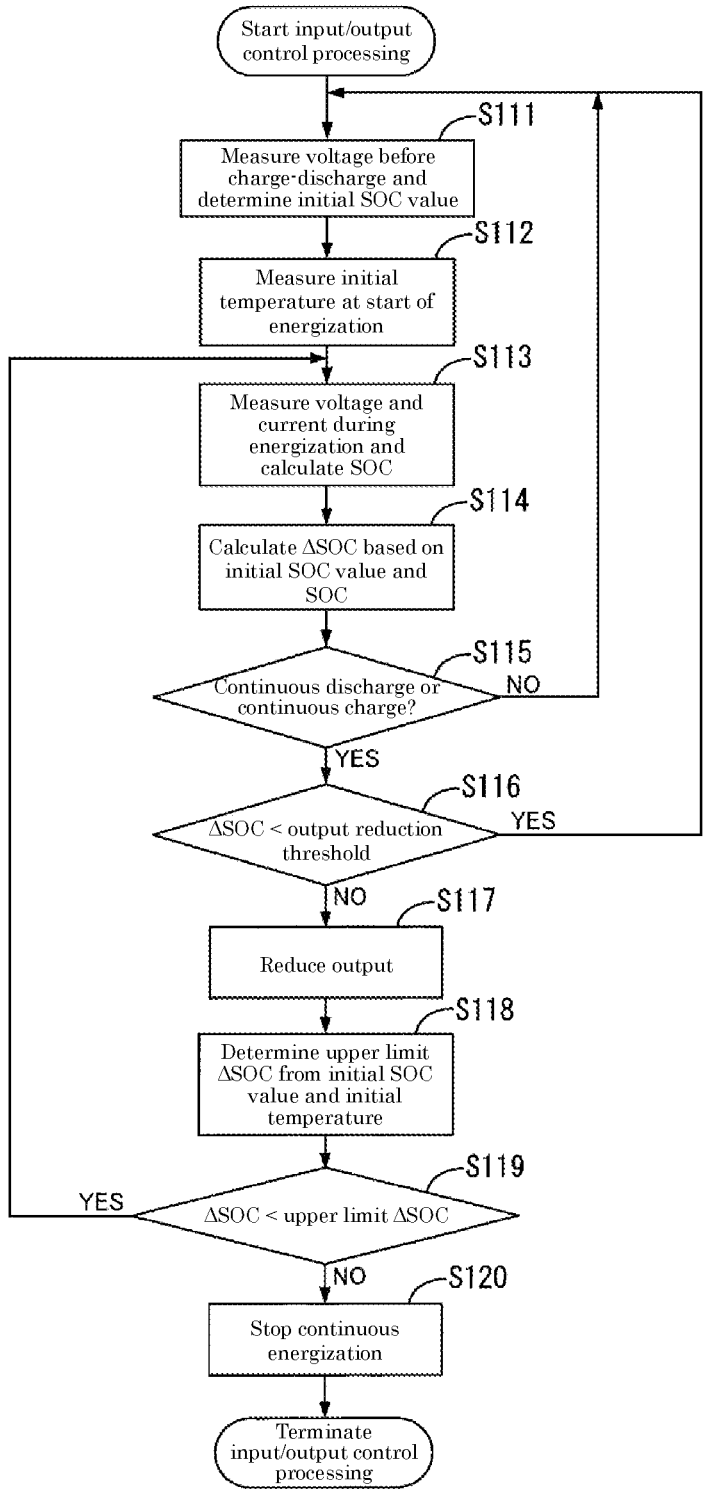
FIG. 19 is a flowchart illustrating input/output control processing according to a second embodiment.

Next, a second embodiment will be described with reference to FIG. 19.

Unlike the first embodiment, the input/output control processing of the second embodiment performs output reduction during charge and discharge before comparing the upper limit $\Delta$SOC with the $\Delta$SOC to extend the time until the $\Delta$SOC reaches the upper limit $\Delta$SOC. The description of configurations, operations, and effects common to those of the first embodiment is omitted because it would be a repeated description, and the same reference numerals are used for the same configurations as those of the first embodiment.

In the output control processing of the second embodiment, first, the CPU 33 gives a command to the voltage detection circuit 31 to detect an open-circuit voltage (OCV) flowing through the assembled battery 20 immediately before the turning-on of the ignition of the vehicle and obtains an initial SOC value from the OCV-SOC correspondence relationship stored in the memory 34 based on the detected OCV (S111). The CPU 33 detects the initial temperature of the assembled battery 20 when the ignition is turned on in accordance with a signal from the temperature measurement unit 42 (S112).

Next, after the start of the energization by the charge and discharge of the assembled battery 20, the CPU 33 calculates a current value by using the output from the current detection unit 41, detects a closed-circuit voltage (CCV) by the voltage detection circuit 31, and calculates an SOC after the start of the energization (S113).

When the SOC is calculated, the electrical quantity of energization is calculated based on the SOC and the initial SOC value, and the $\Delta$SOC is calculated by dividing the electrical quantity of energization by the available capacity stored in the memory 34 (S114).

Next, the CPU 33 determines whether the energization for calculating the $\Delta$SOC is continuous charge or continuous discharge (S115), and when the energization is not continuous charge or continuous discharge (S115: NO), the CPU 33 determines that there is no possibility of reaching the diffusion limitation and returns the processing to S111.

On the other hand, when the energization until the SOC is calculated from the initial SOC value is continuous charge or continuous discharge (S115: YES), the CPU 33 compares the $\Delta$SOC with the output reduction threshold (S116). Here, the output reduction threshold is determined to be a value smaller than the upper limit $\Delta$SOC in accordance with the power consumption of the vehicle load C1 or the like, and for example, the output reduction threshold in the present embodiment is a value of 90% of the upper limit $\Delta$SOC.

Then, when the $\Delta$SOC is smaller than the output reduction threshold (S116: YES), it is determined that continuous energization can be continued without a possibility that a diffusion limitation occurs, and the processing returns to S111.

On the other hand, when the $\Delta$SOC is not smaller than the output reduction threshold (NO in S116), a command is given to the output control circuit 43 to control the output current or the output voltage of the assembled battery 20 (S117).

Next, the CPU 33 determines the upper limit $\Delta$SOC matching the conditions of the initial SOC value and the initial temperature of the assembled battery 20 (S118). The upper limit SOC may be determined from only one condition of the initial SOC value and the initial temperature of the assembled battery 20.

The CPU 33 compares the $\Delta$SOC with the upper limit $\Delta$SOC (S119). When the $\Delta$SOC is smaller than the upper limit $\Delta$SOC (S119: YES), it is determined that the continuous energization can be continued although the output restriction by the output control circuit 43 is continued, and the processing returns to S113.

On the other hand, when the $\Delta$SOC is not smaller than the upper limit $\Delta$SOC (S119: NO), a command is given to the current breaker 44, and the energization interruption by the current breaker 44 stops the continuous energization between the assembled battery 20 and the vehicle generator C2 and between the assembled battery 20 and the vehicle load C1 (S120).

That is, according to the present embodiment, when the $\Delta$SOC exceeds the output reduction reference value set to be lower than the upper limit $\Delta$SOC, the output during the charge and discharge of the assembled battery 20 can be reduced, so that a period until the $\Delta$SOC exceeds the upper limit $\Delta$SOC and the energization of the assembled battery 20 is interrupted can be extended, and a period in which the energy storage apparatus 10 can be charged and discharged can be extended.

Other Embodiments

The technology disclosed in the present specification is not limited to the embodiment described with reference to the above description and drawings but includes, for example, the following various aspects. For example, configurations of other embodiments may be added to the configuration of one embodiment, and a part of the configuration of one embodiment may be replaced with the configuration of another embodiment. Further, a part of the configuration of one embodiment can be eliminated.

(1) In the above embodiment, the energy storage apparatus 10 that is mounted on an electric vehicle or a hybrid vehicle has been described, but the present invention is not limited thereto, and the energy storage apparatus may be configured as an energy storage apparatus in a two-wheeled vehicle, another machine or apparatus, or the like.

(2) In the above embodiment, the SOC, such as the initial SOC value, has been obtained from the OCV-SOC correspondence relationship. However, the present invention is not limited thereto, and the SOC may be obtained by current integration from the start of charge and discharge.

(3) In the above embodiment, the management apparatus 30 is disposed in the case that houses the energy storage device 100 or the assembled battery 20, but the present invention is not limited to this example. The management apparatus 30 or a part of the management apparatus 30 (e.g., the CPU 33 or the memory 34) may be disposed at a place away from the energy storage device 100 (the assembled battery 20). For example, a control unit provided in the vehicle may function as a battery controller for the energy storage device.

In the above embodiment, the upper limit ΔSOC is determined in accordance with the initial SOC value that is the SOC before continuous discharge or continuous charge or the temperature of the energy storage device before continuous discharge or continuous charge, but the present invention is not limited thereto, and the upper limit ΔSOC may be determined in accordance with continuous energization time t0.

The invention claimed is:

1. An apparatus comprising:
    a current detection unit that detects a current flowing through an energy storage device; and
    a control unit,
    wherein the control unit:
        calculates an electrical quantity of energization using a current integration method while determining, based on a signal from the current detection unit, whether the energization has been due to continuous charge or continuous discharge of the energy storage device over a predetermined time;
        calculates ΔSOC, which is obtained when the continuous charge or continuous discharge of the energy storage device is performed over a predetermined time, the ΔSOC being a value obtained by dividing the electrical quantity of energization by an available capacity of the energy storage device; and
        controls input or output of the energy storage device during charge or discharge such that the ΔSOC does not exceed an upper limit ΔSOC, the upper limit ΔSOC being determined based on a temperature of the energy storage device before the continuous charge or continuous discharge.

2. The apparatus according to claim 1, wherein the control unit determines the upper limit ΔSOC based on a state of charge of the energy storage device before continuous charge or continuous discharge.

3. An energy storage apparatus comprising:
    an energy storage device; and
    the apparatus according to claim 2.

4. The energy storage apparatus according to claim 3, further comprising a current breaker that interrupts energization of the energy storage device, wherein when the ΔSOC exceeds the upper limit ΔSOC, the control unit performs interruption control of energization of the energy storage device by the current breaker.

5. An energy storage apparatus comprising:
    an energy storage device; and
    the apparatus according to claim 1.

6. The energy storage apparatus according to claim 5, further comprising a current breaker that interrupts energization of the energy storage device, wherein when the ΔSOC exceeds the upper limit ΔSOC, the control unit performs interruption control of energization of the energy storage device by the current breaker.

7. The energy storage apparatus according to claim 6, further comprising an output control means for reducing output of the energy storage device, wherein when the ΔSOC exceeds an output reduction threshold set to be lower than the upper limit ΔSOC, the control unit performs reduction control of the output of the energy storage device by the output control means.

8. An input/output control method for an energy storage device, the method comprising the steps of:
    calculating, via a control unit, an electrical quantity of energization using a current integration method while determining, based on a signal from a current detection unit that detects a current flowing through the energy storage device, whether the energization has been due to continuous charge or continuous discharge of the energy storage device over a predetermined time;
    calculating, via the control unit, ΔSOC, which is obtained when the continuous charge or continuous discharge of the energy storage device is performed over a predetermined time, the ΔSOC being a value obtained by dividing the electrical quantity of energization by an available capacity of the energy storage device; and
    controlling input or output of the energy storage device during charge or discharge such that the ΔSOC does not exceed an upper limit ΔSOC, the upper limit ΔSOC being determined based on a temperature of the energy storage device before the continuous charge or continuous discharge.

* * * * *